United States Patent
Li et al.

(10) Patent No.: US 12,313,215 B2
(45) Date of Patent: May 27, 2025

(54) DISPLAY DEVICE AND DISPLAY FIXING APPARATUS

(71) Applicants: Chengdu BOE Optoelectronics Technology Co., Ltd., Sichuan (CN); BOE Technology Group Co., Ltd., Beijing (CN)

(72) Inventors: Shanghong Li, Beijing (CN); Yudan Shui, Beijing (CN); Guowei Chen, Beijing (CN); Zhengmao Yu, Beijing (CN); Ping Luo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 250 days.

(21) Appl. No.: 17/916,175

(22) PCT Filed: Jun. 17, 2021

(86) PCT No.: PCT/CN2021/100729
§ 371 (c)(1),
(2) Date: Sep. 30, 2022

(87) PCT Pub. No.: WO2022/017091
PCT Pub. Date: Jan. 27, 2022

(65) Prior Publication Data
US 2023/0151872 A1    May 18, 2023

(30) Foreign Application Priority Data
Jul. 23, 2020 (CN) .......................... 202010716996.1

(51) Int. Cl.
*F16M 13/00*      (2006.01)
*H05K 5/02*      (2006.01)

(52) U.S. Cl.
CPC ......... *F16M 13/005* (2013.01); *H05K 5/0217* (2013.01); *F16M 2200/028* (2013.01)

(58) Field of Classification Search
CPC ........... F16M 13/005; F16M 2200/028; H05K 5/0217; H05K 5/0221
See application file for complete search history.

(56) References Cited

U.S. PATENT DOCUMENTS

| | | |
|---|---|---|
| 2004/0189886 A1 | 9/2004 | Chang et al. |
| 2018/0093466 A1 | 4/2018 | Park et al. |

FOREIGN PATENT DOCUMENTS

| | | |
|---|---|---|
| CN | 201084344 Y | 7/2008 |
| CN | 107654812 A | 2/2018 |

(Continued)

OTHER PUBLICATIONS

English Translation of Chen (CN111140742) (Year: 2024).*

(Continued)

*Primary Examiner* — Matthew W Ing
(74) *Attorney, Agent, or Firm* — XSENSUS LLP (57) ABSTRACT

An apparatus for fixing a display includes a fixing frame and a positioning device. The fixing frame is defined by a plurality of surrounding side plates, a space for accommodating the display is surrounded by the side plates, and a cavity is formed within the side plate. The positioning device is provided within the cavity and includes a positioning assembly and a driving assembly. The positioning assembly includes an inserting-connecting member and a transmission mechanism, the inserting-connecting member is slidably extended into the space surrounded by the side plates, and the inserting-connecting member is connected to the transmission mechanism. The driving assembly is connected to the transmission mechanism and configured to drive, via the transmission mechanism, the inserting-connecting member to slide, so that the inserting-connecting (Continued)

member is inserted into or separated from an inserting hole in the display.

18 Claims, 3 Drawing Sheets

(56) References Cited

FOREIGN PATENT DOCUMENTS

| CN | 207278773 U | | 4/2018 |
|---|---|---|---|
| CN | 207349730 U | | 5/2018 |
| CN | 108545027 A | | 9/2018 |
| CN | 108548067 A | | 9/2018 |
| CN | 208474835 U | | 2/2019 |
| CN | 208670463 U | | 3/2019 |
| CN | 208764633 U | * | 4/2019 |
| CN | 209015115 U | | 6/2019 |
| CN | 209604795 U | | 11/2019 |
| CN | 209782075 U | | 12/2019 |
| CN | 110718142 A | | 1/2020 |
| CN | 210291284 U | | 4/2020 |
| CN | 111140742 A | * | 5/2020 |
| CN | 111779933 A | | 10/2020 |

OTHER PUBLICATIONS

English Translation of Ma (CN208764633) (Year: 2024).*
International Search Report and Written Opinion mailed on Sep. 16, 2021, in corresponding PCT/CN2021/100729, 17 pages.
Office Action issued on Jun. 17, 2021, in corresponding Chinese patent Application No. 202010716996.1, 19 pages.
Office Action issued on Feb. 11, 2022, in corresponding Chinese patent Application No. 202010716996.1, 21 pages.
Office Action issued on May 6, 2022, in corresponding Chinese patent Application No. 202010716996.1, 14 pages.
Notice of Allowance issued on Oct. 24, 2022, in corresponding Chinese patent Application No. 202010716996.1, 6 pages.
Jinguang Yin et al., "The Foundation of Mechanical Design", Jan. 31, 2018, pp. 289-296, total 35 pages with English translation.
Zhenji Pang et al., "Precision Mechanical Design", Jul. 31, 2020, pp. 214-228, total 27 pages with English translation.

* cited by examiner

DISPLAY DEVICE AND DISPLAY FIXING APPARATUS

CROSS-REFERENCE TO RELATED APPLICATIONS

The present disclosure is based upon International Application No. PCT/CN2021/100729 filed on Jun. 17, 2021, which claims the priority of the Chinese patent application with the application number of 202010716996.1 and the title of "DISPLAY DEVICE AND DISPLAY FIXING APPARATUS" submitted on Jul. 23, 2020, and all contents of the Chinese patent application are incorporated herein by reference.

TECHNICAL FIELD

The present disclosure relates to the field of display technologies, in particular, to a display apparatus and an apparatus for fixing a display.

BACKGROUND

At present, displays have been widely used in mobile phones, digital cameras, laptops, televisions, vehicle-mounted displays and other application scenarios. However, in the application scenarios such as the vehicle-mounted display in which shake may be prone to be incurred, the display needs to be fixed in order to ensure the display to be stable in position. Once being fixed, the display is difficult to be demounted, which is not conducive to maintenance and replacement.

It should be noted that the above information disclosed in the background is only used to enhance the understanding of the background of the present disclosure, so it may include information that does not constitute the prior art known to those skilled in the art.

SUMMARY

An aspect of the present disclosure provides an apparatus for fixing a display, including a fixing frame and a positioning device, the fixing frame is defined by a plurality of surrounding side plates, a space for accommodating a display is surrounded by the side plates, and a cavity is formed within the side plate,
the positioning device is provided within the cavity and includes:
a positioning assembly, including an inserting-connecting member and a transmission mechanism, the inserting-connecting member being slidably extended into the space surrounded by the side plates, and the inserting-connecting member being connected to the transmission mechanism; and
a driving assembly, connected to the transmission mechanism and configured to drive, via the transmission mechanism, the inserting-connecting member to slide, so that the inserting-connecting member is inserted into or separated from an inserting hole in the display.

In an exemplary embodiment of the present disclosure, the transmission mechanism includes:
a screw, rotatably provided within the cavity and having a first end and a second end opposite to each other, the first end extending in a direction towards the space surrounded by the side plates, and the second end extending in a direction away from the space surrounded by the side plates;
a connecting member, connected to the inserting-connecting member and fitted with the screw by thread; and
a sliding block, slidably fitted with an inner wall of the cavity and connected to the connecting member,
the sliding block is configured to slide in a straight line along an axial direction of the screw, and
the driving assembly is connected to the screw and is configured to drive the screw to rotate to make the inserting-connecting member slide.

In an exemplary embodiment of the present disclosure, the positioning assembly further includes:
a rotating shaft, rotatably provided within the cavity and having an axis parallel to an axis of the screw:
a first gear, sleeved on the rotating shaft; and
a second gear, sleeved on the screw and engaged with the first gear,
the driving assembly is connected to the rotating shaft to drive the rotating shaft to rotate.

In an exemplary embodiment of the present disclosure, the positioning device includes a plurality of positioning assemblies and a plurality of second gears,
the second gears are sleeved on the respective screws in a one-to-one correspondence, and
the first gear is engaged with the respective second gears at the same time.

In an exemplary embodiment of the present disclosure, the driving assembly includes:
a driving rod, penetrating through the side plate and having an end penetrating into the cavity and another end outside the side plate, the driving rod being perpendicular to the rotating shaft;
a first bevel gear, provided within the cavity and sleeved on the driving rod; and
a second bevel gear, sleeved on the rotating shaft and engaged with the first bevel gear.

In an exemplary embodiment of the present disclosure, said another end of the driving rod outside the side plate is provided with a knob.

In an exemplary embodiment of the present disclosure, the apparatus is provided a plurality of cavities and a plurality of positioning devices, a number of the cavities is the same as a number of the positioning devices, the respective positioning devices are provided within the respective cavities in a one-to-one correspondence, and different cavities are formed in different side plates.

In an exemplary embodiment of the present disclosure, the apparatus further includes:
a bottom plate, the respective side plates being provided on a same surface of the bottom plate; and
a supporting assembly, provided on an area of the bottom plate surrounded by the side plates to support the display, the supporting assembly being an elastic structure.

In an exemplary embodiment of the present disclosure, the supporting assembly includes;
a backing plate, provided within the space surrounded by the side plates and directly opposite to the bottom plate to be attached to the display; and
an elastic member, connected between the backing plate and the bottom plate.

In an exemplary embodiment of the present disclosure, the backing plate includes an elastic material.

In an exemplary embodiment of the present disclosure, the supporting assembly includes a plurality of elastic members, and the plurality of elastic members are evenly arranged between the backing plate and the bottom plate.

In an exemplary embodiment of the present disclosure, the apparatus further includes:
a buffer member, provided within the space surrounded by the side plates and fixed on the side plate,
the buffer member is an elastic structure and is configured to abut against the display.

In an exemplary embodiment of the present disclosure, the buffer member is a sheet-like structure made of a rubber material.

An aspect of the present disclosure provides a display apparatus, including:
any apparatus described above; and
a display, provided within the space surrounded by the side plates and provided with an inserting hole, the inserting-connecting member being inserted into the inserting hole.

It should be understood that the above general description and the following detailed description are only illustrative and explanatory, and do not limit the present disclosure.

BRIEF DESCRIPTION OF THE DRAWINGS

The accompanying drawings herein, which are incorporated in and constitute a part of this specification, illustrate embodiments consistent with the present disclosure, and together with the description serve to explain the principle of the present disclosure. Obviously, the drawings in the following description are only some embodiments of the present disclosure, and for a person skilled in the art, other drawings may also be obtained from these drawings without creative effort.

DETAILED DESCRIPTION

The exemplary embodiments will now be described more fully with reference to the accompanying drawings. However, the exemplary embodiments can be implemented in various forms, and should not be construed as being limited to the embodiments described herein. On the contrary, providing these embodiments will make the present disclosure comprehensive and complete, and will comprehensively convey the concept of the exemplary embodiments to those skilled in the art. The same reference number in the accompanying drawings represents the same or similar structures, and therefore their detailed description will be omitted. In addition, the accompanying drawings are only schematic illustration of the present disclosure and are not necessarily drawn to scale.

The terms "a", "an", "the", "said" and "at least one" are used to indicate the presence of one or more elements/components/etc. The terms "including" and "having" are used to indicate an open-ended inclusive meaning and mean that there may be additional elements/components/etc., in addition to the listed elements/components/etc. The terms "first" and "second" are only used as marks and are not intended to limit the number of their objects.

An embodiment of the present disclosure provides an apparatus for fixing a display. The display may be an OLED (organic light-emitting diode) display, a liquid crystal display, etc., which is not specifically limited herein. The display may include a housing and a display panel located within the housing. The specific structure of the display is not specifically limited herein.

Figure 1:
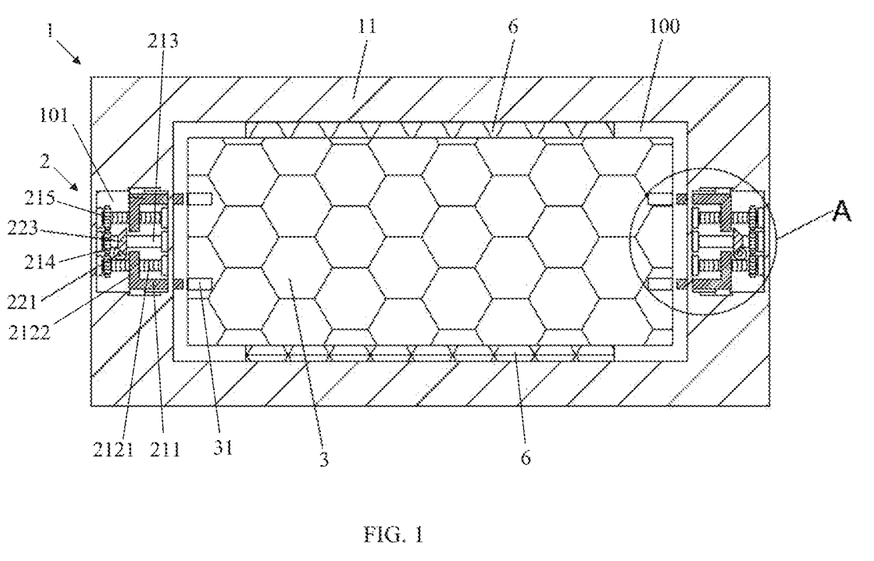
FIG. 1 is a top perspective view of an apparatus for fixing a display according to an embodiment of the present disclosure.
Figure 2:
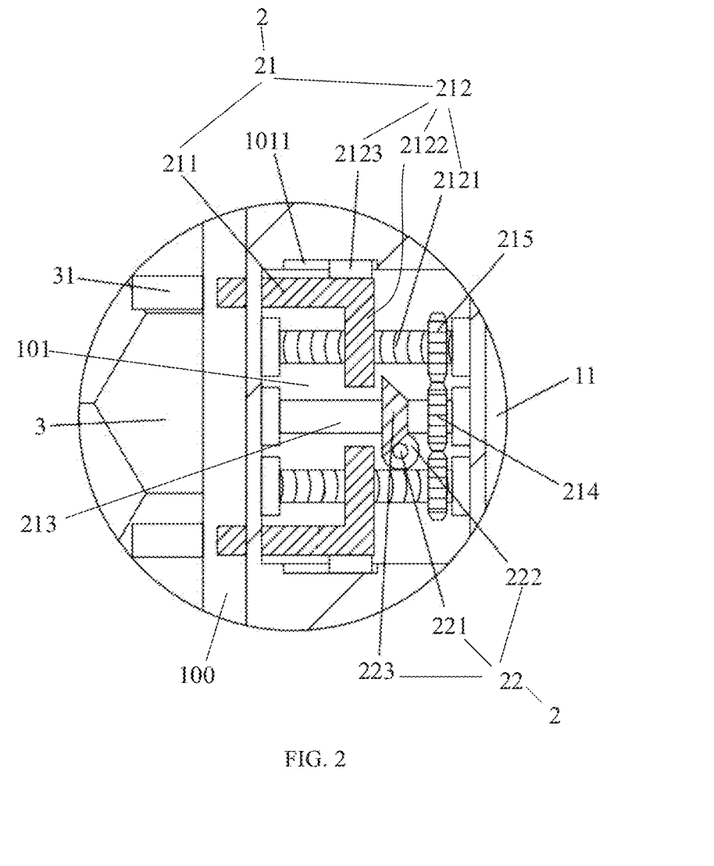
FIG. 2 is an enlarged view of a part A in FIG. 1.
Figure 3:
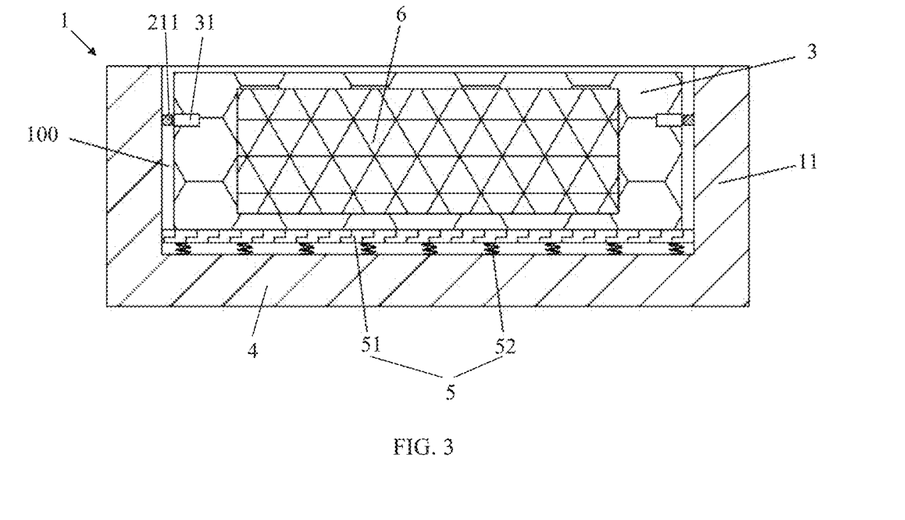
FIG. 3 is a side perspective view of an apparatus for fixing a display according to an embodiment of the present disclosure.

As shown in FIGS. 1 to 3, the fixing apparatus according to an embodiment of the present disclosure may include a fixing frame 1 and a positioning device 2. The fixing frame 1 is defined by a plurality of surrounding side plates 11, a space surrounded by the side plates 11 may accommodate a display 3, and a cavity 101 is formed within the side plate 11. In the embodiments of the present disclosure, the space surrounded by the side plates 11, that is, the space surrounded by the fixing frame 1, may be named as an accommodating space 100.

The positioning device 2 is provided within the cavity 101, and the positioning device 2 includes a positioning assembly 21 and a driving assembly 22.

The positioning assembly 21 includes a inserting-connecting member 211 and a transmission mechanism 212, the inserting-connecting member 211 may be slidably extended into the accommodating space 100, that is, may be inserted into the accommodating space 100, and the inserting-connecting member 211 is connected to the transmission mechanism 212.

The driving assembly 22 is connected to the transmission mechanism 212 to drive, via the transmission mechanism 212, the inserting-connecting member 211 to slide, so that the inserting-connecting member 211 may be inserted into or separated from a inserting hole 31 in the display 3. The inserting hole 31 may be disposed in a housing of the display 3.

In the fixing apparatus according to an embodiment of the present disclosure, when the display 3 is mounted, the display 3 is placed in the space surrounded by the side plates 11 of the fixing frame 1, and then the inserting-connecting member 211 is driven to slide by the driving assembly 22 through the transmission mechanism 212 until being inserted into the inserting hole 31 of the display 3, so as to realize the positioning of the display 3 and prevent the display 3 from moving in the fixing frame 1. When the display 3 is demounted, it may slide the inserting-connecting member 211 out of the inserting hole 31 (i.e., to be separated from the inserting hole) through the driving assembly 22, so that the positioning of the display 3 may be released, and the display 3 may be taken out from the fixing apparatus. In this way, convenient mounting and demounting of the display 3 may be realized. At the same time, whether the display 3 is in a suitable position in the fixing frame 1 may be determined based on whether the inserting hole 31 and the inserting-connecting member 211 are aligned or not, which is convenient for positioning.

The fixing apparatus of the present disclosure is described in detail below.

As shown in FIGS. 1 and 3, the fixing frame 1 may be defined by a plurality of side plates 11, which may be rectangular flat plates. Correspondingly, the fixing frame 1 has a shape of polygon. Of course, the side plate 11 may also be an arc plate, and the fixing frame 1 may has a shape of circle or oval. The number and shape of the side plates 11 are not specifically limited herein.

The display 3 may be accommodated within the accommodating space 100 surrounded by the side plates 11 of the fixing frame 1, and the shape of the fixing frame 1 may match the shape of the display 3. For example, the display 3 is rectangular, and the fixing frame 1 also is rectangular, correspondingly the fixing frame 1 may be defined by four side plates 11. The shape of the display 3 refers to the shape of the housing thereof. An inner side surface of the fixing frame 1 (i.e., an inner side surface of the side plate 11) may attach to the outer surface of the display 3, or may have a gap with the outer surface of the display 3.

In addition, the cavity 101 is formed within at least one of the side plates 11, and the cavity 101 is used to accommodate the positioning device 2. The size and shape of the cavity 101 are not specifically limited herein. Meanwhile, the number of the cavities 101 is the same as that of the positioning devices 2. If the number of the positioning devices 2 is one, the number of the cavities 101 is one. If the number of the positioning devices 2 is multiple, the number of the cavities 101 may be multiple. Different cavities 101 may be arranged in different side plates 11, so that the display 3 is positioned from multiple orientations.

It should be noted that the positioning device 2 described herein is provided within the cavity 101, which is not limited to that the positioning device 2 is completely located within the cavity 101, and the positioning device 2 may extend out of the cavity 101 partially.

The following describes the positioning device 2 by taking one cavity 101 and the positioning device 2 provided within the cavity as an example.

As shown in FIGS. 1 to 3, the positioning device 2 may be provided within the cavity 101 to position the display 3 within the accommodating space 100. The positioning device 2 may include a positioning assembly 21 and a driving assembly 22.

As shown in FIGS. 1 and 2, the positioning assembly 21 may include a inserting-connecting member 211 and a transmission mechanism 212. The inserting-connecting member 211 may be a rod-like structure, which is provided within the cavity 101. An end of the inserting-connecting member 211 passes through a sidewall of the cavity 101, i.e., passes through an inner wall of the side plate 11 where the cavity 101 is located, and inserts into the accommodating space 100. For example, the cavity 101 is provided with an opening towards the accommodating space 100, and the inserting-connecting member 211 may pass through the opening and insert into the accommodating space 100. The inserting-connecting member 211 may slide back and forth in a straight line with respect to the opening.

The inserting-connecting member 211 may be fitted with and inserted into the inserting hole 31 in the display 3 to limit the display 3 within the fixing frame 1. Of course, the inserting-connecting member 211 may also slide in a direction away from the accommodating space 100 and slide out of the inserting hole 31 to facilitate the demounting of the display 3.

The transmission mechanism 212 may be connected to the inserting-connecting member 211, and may drive the inserting-connecting member 211 to move back and forth in a straight line, so that the inserting-connecting member 211 can slide into or out of the inserting hole 31 to insert into or separate from the inserting hole 31.

In some embodiments of the present disclosure, as shown in FIGS. 1 and 2, the transmission mechanism 212 may drive the inserting-connecting member 211 to move according to the transmission principle of the lead screw nut. Specifically, the transmission mechanism 212 may include a screw 2121, a connecting member 2122 and a sliding block 2123.

The screw 2121 is rotatably provided within the cavity 101, and has two opposite ends, namely a first end and a second end. The first end extends in a direction towards the accommodating space 100, and the second end extends in a direction away from the accommodating space 100. For example, both ends of the screw 2121 are rotatably connected to the inner wall of the cavity 101. In order to facilitate the installation of the screw 2121, two opposite supporting bases may be formed on the inner wall of the cavity 101, and both ends of the screw 2121 may be rotatably provided in the two supporting bases.

The connecting member 2122 may be fitted with the screw 2121 by thread and connected to the inserting-connecting member 211 to drive the connecting member 2122 to move synchronously. For example, the screw 2121 may pass through the connecting member 2122 and is connected to the connecting member 2122 through thread. The connecting member 2122 may extend along a radial direction of the screw 2121 and be perpendicular to the inserting-connecting member 211. The connecting member 2122 may be connected with the inserting-connecting member 211 by clamping, welding or other fixed connection manners. Of course, the inserting-connecting member 211 may be integrated with the connecting member 2122.

The sliding block 2123 is slidably fitted with an inner wall of the cavity 101 and connected to the connecting member 2122. When the screw 2121 rotates, the sliding block 2123 may cause the connecting member 2122 unable to rotate along with the screw 2121, but can only move in a straight line, which thus drives the inserting-connecting member 211 to move in a straight line along an axial direction of the screw 2121. The axial direction of the screw 2121 is an extension direction of the rotation center axis of the screw 2121. For example, the inner wall of the cavity 101 may be provided with a sliding groove 1011 that extends in a straight line along the axial direction of the screw 2121. The sliding block 2123 is slidably fitted within the sliding groove 1011, so that the connecting member 2122 may slide in a straight line along the sliding groove 1011.

As shown in FIGS. 1 and 2, the driving assembly 22 is connected with the screw 2121 and may drive the screw 2121 to rotate so that the inserting-connecting member 211 slides in a straight line. In order to drive the rotation of the screw 2121, in some embodiments of the present disclosure, the positioning assembly 21 may also include a rotating shaft 213, a first gear 214 and a second gear 215.

The rotating shaft 213 may be rotatably provided within the cavity 101, and an axis of the rotating shaft 213 is parallel to an axis of the screw 2121. The installation manner of the rotating shaft may be the same as that of the screw 2121, as long as it can rotate within the cavity 101. The axis of the rotating shaft 213 is a connecting line between the centers of the two end faces of the rotating shaft 213, and the axis of the screw 2121 is a connecting line between the centers of the two end faces of the screw 2121.

The first gear 214 is sleeved on the rotating shaft 213, and may be fixed to the rotating shaft 213 by means of a bonding connection and the like. Of course, the first gear 214 may also be integrated with the rotating shaft 213, so that the first gear 214 may rotate synchronously with the rotating shaft 213.

The second gear 215 may be sleeved on the screw 2121, and may be fixed to the screw 2121 by means of a bonding connection and the like. Of course, the second gear 215 may also be integrated with the screw 2121, so that the second gear 215 may rotate synchronously with the screw 2121. At the same time, the second gear 215 is engaged with the first gear 214. When the rotating shaft 213 rotates, the screw 2121 may be driven to rotate through the first gear 214 and the second gear 215. The driving assembly 22 may be connected to the rotating shaft 213, and the inserting-connecting member 211 may slide in a straight line simply by driving the rotating shaft 213 to rotate.

Further, as shown in FIGS. 1 and 2, in some embodiments of the present disclosure, in the same positioning device 2, both of the number of the positioning assembly 21 and the number of the second gear 215 are multiple. The structure of the positioning assembly 21 may refer to the above embodiments, and will not be repeated here. At the same time, the second gears 215 are sleeved on the respective screws 2121 in a one-to-one correspondence, and the first gear 214 is engaged with the respective second gears 215 at the same time. Thus, the inserting-connecting members 211 in multiple positioning assemblies 21 may be driven simultaneously by one rotating shaft 213 to move synchronously and straightly. Correspondingly, each area of the display 3 corresponding to the inserting-connecting member 211 is provided with the inserting hole 31, so that the multiple inserting-connecting members 211 may be inserted into the display 3 at the same time, and thus the display 3 may be not easy to become loose or move in the fixing apparatus.

As shown in FIGS. 1 and 2, the driving assembly 22 may be connected to the transmission mechanism 212 to drive the inserting-connecting member 211 to slide in a straight line. In some embodiments of the present disclosure, the driving assembly 22 may include a driving rod 221, a first bevel gear 222 and a second bevel gear 223.

The driving rod 221 may be provided to pass through the side plate 11, and has an end inserting into the cavity 101 and another end outside the side plate 11, that is, the driving rod 221 extends from the outside of the side plate 11 into the cavity 101. At the same time, the driving rod 221 is provided perpendicular to the rotating shaft 213.

The first bevel gear 222 may be provided within the cavity 101 and sleeved on the driving rod 221, and may be fixed on the driving rod 221 by means of a bonding connection and the like. Of course, the first bevel gear 222 may also be integrated with the driving rod 221. Thus, the first bevel gear 222 may rotate synchronously with the driving rod 221.

The second bevel gear 223 may be provided within the cavity 101 and sleeved on the rotating shaft 213, and may be fixed on the rotating shaft 213 by means of a bonding connection and the like. Of course, the second bevel gear 223 may also be integrated with the rotating shaft 213. At the same time, the second bevel gear 223 is engaged with the first bevel gear 222, and the driving rod 221 may be rotated outside the side plate 11. Through the transmission of the second bevel gear 223 and the first bevel gear 222, the rotating shaft 213 may be rotated, so that the inserting-connecting member 211 may slide in a straight line.

Further, in order to facilitate the rotation of the driving rod 221, the end of the driving rod 221 located outside the side plate 11 may have a knob (not shown), and a user may directly rotate the knob to rotate the driving rod 221. The knob may be a round knob, a multilateral knob, a pointer knob, and the like, the structure of which is not specifically limited herein, as long as it can enable the driving rod 221 to rotate.

In some embodiments of the present disclosure, as shown in FIG. 1, the display 3 may be positioned by a plurality of positioning device 2. Specifically, the number of the cavities 101 and the number of the positioning devices 2 are the same, and both are multiple. The respective positioning devices 2 are provided within the respective cavities 101 in a one-to-one correspondence, and different cavities 101 are formed in different side plates 11, for example, formed in two opposite side plates 11. The areas of the display 3 corresponding to the inserting-connecting members 211 are all provided with inserting holes 31, so that the display 3 may be limited from multiple orientations. Each positioning device 2 may be independently controlled by its own driving assembly 22. For example, the user may independently rotate the knob of each positioning device 2 to make its inserting-connecting member 211 slide in a straight line. The specific structure and fitting relationship of the positioning device 2 and the cavity 101 in which it is located may refer to the above embodiments, and will not be repeated here.

In some other embodiments of the present disclosure, the driving assembly 22 may also have other structures, for example, the driving assembly 22 may include a motor and a controller. The motor may be connected to the screw 2121, and the controller may control the motor to rotate, to cause the inserting-connecting member 211 to slide in a straight line. Alternatively, the motor may be connected to the rotating shaft 213 to realize the linear sliding of the inserting-connecting member 211.

In addition, the end of the screw 2121 away from the accommodating space 100 may be extended outside of the outer side surface of the side plate 11, and the end of the screw 2121 located outside the side plate 11 may be provided with a knob, so that the screw 2121 may be directly rotated by manual rotation to realize the linear sliding of the inserting-connecting member 211. Of course, the end of the rotating shaft 213 away from the accommodating space 100 may be extended outside of the outer side surface of the side plate 11, and the end of the rotating shaft 213 located outside the side plate 11 may be provided with a knob, so that the rotating shaft 213 may be directly rotated by manual rotation to realize the linear sliding of the inserting-connecting member 211.

In other embodiments of the present disclosure, the inserting-connecting member 211 may be driven by a driving device to slide back and forth in a straight line through a transmission mechanism, which can also realize the positioning of the display 3. The driving device may be an air cylinder, a hydraulic cylinder, a linear motor and other devices that may directly realize linear movement, and the transmission mechanism may be a connecting rod or other connecting structure connecting the driving device and the inserting-connecting member 211.

In order to buffer and protect the display 3, as shown in FIG. 2, in some embodiments of the present disclosure, the fixing apparatus may also include a bottom plate 4 and a supporting assembly 5.

The bottom plate 4 may be a flat plate structure, and the fixing frame 1 may be provided on a surface of the bottom plate 4, that is, the respective side plates 11 are provided on a same surface of the bottom plate 4. A boundary of an orthographic projection of the fixing frame 1 on the bottom plate 4 may coincide with a boundary of the bottom plate 4.

At the same time, the fixing frame 1 and the bottom plate 4 may be connected by clamping, screw connection and other removable manners, or by welding, riveting and other fixing manners. Of course, the bottom plate 4 may also be integrated with the fixing frame 1.

The supporting assembly 5 may be provided on an area of the bottom plate 4 surrounded by the side plates 11 to support the display 3, and the supporting assembly 5 is an elastic structure. If the display 3 is subjected to an action force towards the bottom plate 4, the supporting assembly 5 may buffer the display 3 to prevent it from being damaged due to collision.

Further, for example, as shown in FIG. 1, the supporting assembly 5 may include a backing plate 51 and an elastic member 52.

The backing plate 51 may be a flat plate structure, which may be provided within the accommodating space 100 and be provided directly opposite to the bottom plate 4. For example, the backing plate 51 may be provided in parallel with the bottom plate 4, and the backing plate 51 may be attached to the display 3 to support and buffer the display 3. The material of the backing plate 51 may be an elastic material, which may play a buffer role to avoid damage to the display 3. For example, the material of the backing plate 51 may be butadiene rubber, so that the backing plate has good wear resistance and elasticity, and has less heat generation and aging resistance under dynamic load. Of course, the material of backing plate 51 may also be hard materials such as metal.

The elastic member 52 is connected between the backing plate 51 and the bottom plate 4, so that buffering between the backing plate 51 and the bottom plate 4 may be achieved. The elastic member 52 may be a spring or an elastic member formed by elastic material such as rubber and silica gel and the like, as long as it is elastic. In addition, the elastic member 52 may be fixed to the bottom plate 4 and the backing plate 51 by welding or other means, or the elastic member 52 may be directly abutted against the bottom plate 4 and the backing plate 51 without fixing connection, as long as buffering can be achieved.

Further, in order to make the force on the display 3 uniform and improve the buffering effect, the number of the elastic members 52 is multiple and the elastic members 52 are evenly arranged between the backing plate 51 and the bottom plate 4.

As shown in FIGS. 1 and 2, in some embodiments of the present disclosure, the fixing apparatus may also include a buffer member 6, which may be provided within the accommodating space 100 and fixed on the side plate 11. The buffer member 6 is an elastic structure, for example, the buffer member 6 may be a rubber sheet-like structure, and the rubber may also be butadiene rubber. The buffer member 6 may be fixed on the inner side surface of the side plate 11 by adhesion or other means.

The number of the buffer members 6 may be multiple, and the inner side surface of each side plate 11 may be provided with the buffer member 6. The display 3 may be abutted against each buffer member 6, so that the display 3 may be limited and buffered by the buffer member 6.

The display 3 may be buffered through the supporting assembly 5 and the buffer member 6 from two directions to avoid the damage of the display 3 due to external forces, which may prolong the service life and reduce the cost.

An embodiment of the present disclosure also provides a display apparatus, as shown in FIGS. 1 to 3, which includes the fixing apparatus and the display 3. The display 3 may be provided within the accommodating space 100, and the periphery of the display 3 is provided with the inserting hole 31. The inserting-connecting member 211 may slide back and forth in a straight line, so that it may fit with and slide into the inserting hole 31 and be inserted into the inserting hole 31, or slide out of the inserting hole 31 to separate from the inserting hole 31. The detailed structure, working principle and beneficial effects of the fixing apparatus have been described in the above embodiments. For details, reference may be made to any embodiment of the fixing apparatus above, which will not be described in detail here.

After considering the specification and practicing the present disclosure disclosed herein, those skilled in the art will easily think of other embodiments of the present disclosure. The present application is intended to cover any variant, use or adaptive change of the present disclosure, which follows the general principles of the present disclosure and includes the common general knowledge or frequently used technical means in the technical field not disclosed in the present disclosure. The description and embodiments are only regarded as exemplary, and the true scope and spirit of the present disclosure are indicated by the appended claims.

What is claimed is:

1. An apparatus for fixing a display, comprising a fixing frame and a positioning device, wherein
   the fixing frame is defined by a plurality of surrounding side plates, a space for accommodating the display is surrounded by the side plates, and a cavity is formed within the side plate,
   the positioning device is provided within the cavity and comprises:
   a positioning assembly, comprising an inserting-connecting member and a transmission mechanism, the inserting-connecting member being slidably extended into the space surrounded by the side plates, and the inserting-connecting member being connected to the transmission mechanism; and
   a driving assembly, connected to the transmission mechanism and configured to drive, via the transmission mechanism, the inserting-connecting member to slide, so that the inserting-connecting member is inserted into or separated from an inserting hole in the display,
   wherein the transmission mechanism comprises:
   a screw, rotatably provided within the cavity and having a first end and a second end opposite to each other, the first end extending in a direction towards the space surrounded by the side plates, and the second end extending in a direction away from the space surrounded by the side plates;
   a connecting rod, connected to the inserting-connecting member and fitted with the screw by thread; and
   a sliding block, slidably fitted with an inner wall of the cavity and directly connected to the rod,
   wherein the sliding block is configured to slide in a straight line along an axial direction of the screw, and
   the driving assembly is connected to the screw and is configured to drive the screw to rotate to make the inserting-connecting member slide,
   wherein the screw is spaced apart from the inserting-connecting member in a radial direction of the screw,
   wherein the connecting rod extends along the radial direction of the screw, and has a first end and a second end along the radial direction of the screw, the first end of the rod is connected to the inserting-connecting member, and the second end of the connecting rod is fitted with the screw by the thread.

2. The apparatus according to claim 1, wherein the positioning assembly further comprises:
   a rotating shaft, rotatably provided within the cavity and having an axis parallel to an axis of the screw;
   a first gear, sleeved on the rotating shaft; and
   a second gear, sleeved on the screw and engaged with the first gear,
   wherein the driving assembly is connected to the rotating shaft to drive the rotating shaft to rotate.

3. The apparatus according to claim 2, wherein the positioning device comprises a plurality of positioning assemblies and a plurality of second gears,
   the second gears are sleeved on the respective screws in a one-to-one correspondence, and
   the first gear is engaged with the respective second gears at the same time.

4. The apparatus according to claim 2, wherein the driving assembly comprises:
a driving rod, penetrating through the side plate and having an end penetrating into the cavity and another end outside the side plate, the driving rod being perpendicular to the rotating shaft;
a first bevel gear, provided within the cavity and sleeved on the driving rod; and
a second bevel gear, sleeved on the rotating shaft and engaged with the first bevel gear.

5. The apparatus according to claim 4, wherein said another end of the driving rod outside the side plate is provided with a knob.

6. The apparatus according to claim 1, wherein the apparatus is provided a plurality of cavities and a plurality of positioning devices, a number of the cavities is the same as a number of the positioning devices, the respective positioning devices are provided within the respective cavities in a one-to-one correspondence, and different cavities are formed in different side plates.

7. The apparatus according to claim 1, further comprising:
a bottom plate, the respective side plates being provided on a same surface of the bottom plate; and
a supporting assembly, provided on an area of the bottom plate surrounded by the side plates to support the display, the supporting assembly being an elastic structure.

8. The apparatus according to claim 7, wherein the supporting assembly comprises:
a backing plate, provided within the space surrounded by the side plates and directly opposite to the bottom plate to be attached to the display; and
an elastic member, connected between the backing plate and the bottom plate.

9. The apparatus according to claim 8, wherein the backing plate comprises an elastic material.

10. The apparatus according to claim 8, wherein the supporting assembly comprises a plurality of elastic members, and the plurality of elastic members are evenly arranged between the backing plate and the bottom plate.

11. The apparatus according to claim 1, further comprising:
a buffer member, provided within the space surrounded by the side plates and fixed on the side plate,
wherein the buffer member is an elastic structure and is configured to abut against the display.

12. The apparatus according to claim 11, wherein the buffer member is a sheet-shaped structure made of a rubber material.

13. A display apparatus, comprising an apparatus for fixing a display and the display, wherein:
the apparatus for fixing the display comprises a fixing frame and a positioning device,
the fixing frame is defined by a plurality of surrounding side plates, a space for accommodating the display is surrounded by the side plates, and a cavity is formed within the side plate,
the positioning device is provided within the cavity and comprises:
a positioning assembly, comprising an inserting-connecting member and a transmission mechanism, the inserting-connecting member being slidably extended into the space surrounded by the side plates, and the inserting-connecting member being connected to the transmission mechanism; and a driving assembly, connected to the transmission mechanism and configured to drive, via the transmission mechanism, the inserting-connecting member to slide, so that the inserting-connecting member is inserted into or separated from an inserting hole in the display,
wherein the transmission mechanism comprises:
a screw, rotatably provided within the cavity and having a first end and a second end opposite to each other, the first end extending in a direction towards the space surrounded by the side plates, and the second end extending in a direction away from the space surrounded by the side plates;
a connecting rod, connected to the inserting-connecting member and fitted with the screw by thread; and
a sliding block, slidably fitted with an inner wall of the cavity and directly connected to the connecting rod,
wherein the sliding block is configured to slide in a straight line along an axial direction of the screw, and
the driving assembly is connected to the screw and is configured to drive the screw to rotate to make the inserting-connecting member slide,
wherein the screw is spaced apart from the inserting-connecting member in a radial direction of the screw,
wherein the connecting rod extends along the radial direction of the screw, and has a first end and a second end along the radial direction of the screw, the first end of the connecting rod is connected to the inserting-connecting member, and the second end of the connecting rod is fitted with the screw by the thread.

14. The display apparatus according to claim 13, wherein the positioning assembly further comprises:
a rotating shaft, rotatably provided within the cavity and having an axis parallel to an axis of the screw;
a first gear, sleeved on the rotating shaft; and
a second gear, sleeved on the screw and engaged with the first gear,
wherein the driving assembly is connected to the rotating shaft to drive the rotating shaft to rotate.

15. The display apparatus according to claim 14, wherein the positioning device comprises a plurality of positioning assemblies and a plurality of second gears,
the second gears are sleeved on the respective screws in a one-to-one correspondence, and
the first gear is engaged with the respective second gears at the same time.

16. The display apparatus according to claim 14, wherein the driving assembly comprises:
a driving rod, penetrating through the side plate and having an end penetrating into the cavity and another end outside the side plate, the driving rod being perpendicular to the rotating shaft;
a first bevel gear, provided within the cavity and sleeved on the driving rod; and
a second bevel gear, sleeved on the rotating shaft and engaged with the first bevel gear.

17. The display apparatus according to claim 16, wherein said another end of the driving rod outside the side plate is provided with a knob.

18. The display apparatus according to claim 13, wherein the apparatus is provided a plurality of cavities and a plurality of positioning devices, a number of the cavities is the same as a number of the positioning devices, the respective positioning devices are provided within the respective cavities in a one-to-one correspondence, and different cavities are formed in different side plates.

* * * * *